United States Patent
Lu et al.

(10) Patent No.: US 12,412,721 B2
(45) Date of Patent: Sep. 9, 2025

(54) SOLID-STATE CIRCUIT BREAKER AND ITS SELF-TEST METHOD

(71) Applicant: Schneider Electric (China) Co., Ltd., Beijing (CN)

(72) Inventors: Feng Lu, Beijing (CN); Haijun Zhao, Beijing (CN); Jiamin Chen, Beijing (CN); Jialu Bai, Beijing (CN)

(73) Assignee: Schneider Electric (China) Co., Ltd., Beijing (CN)

( * ) Notice: Subject to any disclaimer, the term of this patent is extended or adjusted under 35 U.S.C. 154(b) by 172 days.

(21) Appl. No.: 18/527,942

(22) Filed: Dec. 4, 2023

(65) Prior Publication Data
US 2025/0104954 A1    Mar. 27, 2025

(30) Foreign Application Priority Data
Sep. 27, 2023    (CN) .......................... 202311262309.3

(51) Int. Cl.
*H02H 3/00* (2006.01)
*G01R 31/327* (2006.01)
(Continued)

(52) U.S. Cl.
CPC ......... *H01H 83/04* (2013.01); *G01R 31/3275* (2013.01); *H02H 1/0007* (2013.01); *H02H 3/044* (2013.01)

(58) Field of Classification Search
CPC ...... H01H 83/04; H02H 3/044; H02H 1/0007; G01R 31/3275
(Continued)

(56) References Cited

U.S. PATENT DOCUMENTS

| | | |
|---|---|---|
| 2016/0225564 A1 | 8/2016 | Tanaka |
| 2018/0045783 A1 | 2/2018 | Wu et al. |

(Continued)

FOREIGN PATENT DOCUMENTS

EP    3667341 A1    6/2020

OTHER PUBLICATIONS

Extended European Search Report dated Jun. 18, 2024 for corresponding European Patent Application No. 23214103.6-1002, 8 pages.

*Primary Examiner* — Sean Kayes
*Assistant Examiner* — Lucy M Thomas
(74) *Attorney, Agent, or Firm* — Troutman Pepper Locke LLP

(57) ABSTRACT

According to an embodiment of the present disclosure, there is provided a solid-state circuit breaker and its self-test method. The solid-state circuit breaker comprises an input end and an output end, the input end being adapted to be connected to a mechanical switch; a first switching device connected between the input end and a first node; a second switching device connected between the first node and the output end; a third switching device and a first resistive element connected in series between the input end and the output end; an auxiliary power branch connected between the first node and a second node; an anti-reverse connection circuit connected between the second node and the input end and between the second node and the output end, and configured to allow a current to flow unidirectionally from the second node to the input end and the output end; a first current sensor configured to sense a current flowing through the second switching device and generate a first current signal; a second current sensor configured to sense a current flowing through the auxiliary power branch and generate a second current signal; and a control unit configured to (Continued)

determine operation states of the first switching device and the second switching device based on the first current signal and the second current signal.

20 Claims, 4 Drawing Sheets

(51) Int. Cl.
    *H01H 83/04*     (2006.01)
    *H02H 1/00*     (2006.01)
    *H02H 3/04*     (2006.01)
    *H02H 9/08*     (2006.01)

(58) Field of Classification Search
    USPC .......................................................... 361/42
    See application file for complete search history.

(56) References Cited

U.S. PATENT DOCUMENTS

| | | | |
|---|---|---|---|
| 2019/0386484 A1 | 12/2019 | Lee et al. | |
| 2022/0206046 A1* | 6/2022 | Kang | G01R 19/16571 |
| 2025/0080110 A1* | 3/2025 | Yun | H03K 17/08142 |

\* cited by examiner

SOLID-STATE CIRCUIT BREAKER AND ITS SELF-TEST METHOD

FIELD

Example embodiments of the present disclosure generally relates to the technical field of electrical equipment, and more particularly, to a solid-state circuit breaker and its self-test method.

BACKGROUND

A solid-state circuit breaker is a future development trend of low voltage terminal power distribution equipment. Considering safety of the user side, as well as semiconductor properties, temperature rise, and overcurrent of the solid-state circuit breaker itself, it is an important measure to regularly perform self-test for switching devices in the solid-state circuit breaker to ensure the safety of terminal power distribution. Currently, most solid-state circuit breakers in the industry have not considered regular self-test for the solid-state switching devices, or only partial self-test for switching-off function of the circuit breaker can be achieved by briefly turning off the solid-state switching devices during operation. Therefore, conventional solid-state circuit breakers lack a perfect self-test function for the solid-state switching devices, which has safety hazards. In addition, self-test in the event of power down will affect the operation of a subsequent circuit.

SUMMARY

Embodiments of the present disclosure provides a solid-state circuit breaker and its self-test method to at least partially solve the above and other potential problems.

In a first aspect of the present disclosure, there is provided a solid-state circuit breaker, comprising: an input end and an output end, the input end being adapted to be connected to a mechanical switch; a first switching device connected between the input end and a first node; a second switching device connected between the first node and the output end; a third switching device and a first resistive element connected in series between the input end and the output end; an auxiliary power branch connected between the first node and a second node; an anti-reverse connection circuit connected between the second node and the input end and between the second node and the output end, and configured to allow a current to flow unidirectionally from the second node to the input end and the output end; a first current sensor configured to sense a current flowing through the second switching device and generate a first current signal; a second current sensor configured to sense a current flowing through the auxiliary power branch and generate a second current signal; and a control unit configured to determine operation states of the first switching device and the second switching device based on the first current signal and the second current signal.

In a second aspect of the present disclosure, there is provided a method for performing self-test of a solid-state circuit breaker. The solid-state circuit breaker comprises an input end and an output end, the input end being adapted to be connected to a mechanical switch; a first switching device connected between the input end and a first node; a second switching device connected between the first node and the output end; a third switching device and a first resistive element connected in series between the input end and the output end; an auxiliary power branch connected between the first node and a second node; an anti-reverse connection circuit connected between the second node and the input end and between the second node and the output end, and configured to allow a current to flow unidirectionally from the second node to the input end and the output end; a first current sensor configured to sense a current flowing through the second switching device and generate a first current signal; and a second current sensor configured to sense a current flowing through the auxiliary power branch and generate a second current signal. The method comprises: receiving the first current signal from the first current sensor; receiving the second current signal from the second current sensor; and determining operation states of the first switching device and the second switching device based on the first current signal and the second current signal.

According to embodiments of the present disclosure, a self-test scheme is provided for the solid-state circuit breaker, which can provide the self-test function in two situations, i.e., before the solid-state circuit breaker is powered on and during operation of the solid-state circuit breaker. This self-test scheme can ensure the safe and reliable operation of the solid-state circuit breaker and can achieve accurate self-test without power down in the subsequent circuit.

It should be understood that the content described in this section is not intended to limit critical or important features of the embodiments of the present disclosure, nor is it used to limit the scope of the present disclosure. Other features of the present disclosure will become easier to be understood through the following description.

BRIEF DESCRIPTION OF THE DRAWINGS

The above and other features, advantages, and aspects of each embodiment of the present disclosure will become more apparent in conjunction with the accompanying drawings and with reference to the following detailed explanations. In the accompanying drawings, the same or similar reference symbols represent the same or similar elements, where.

DETAILED DESCRIPTION

Figure 1:
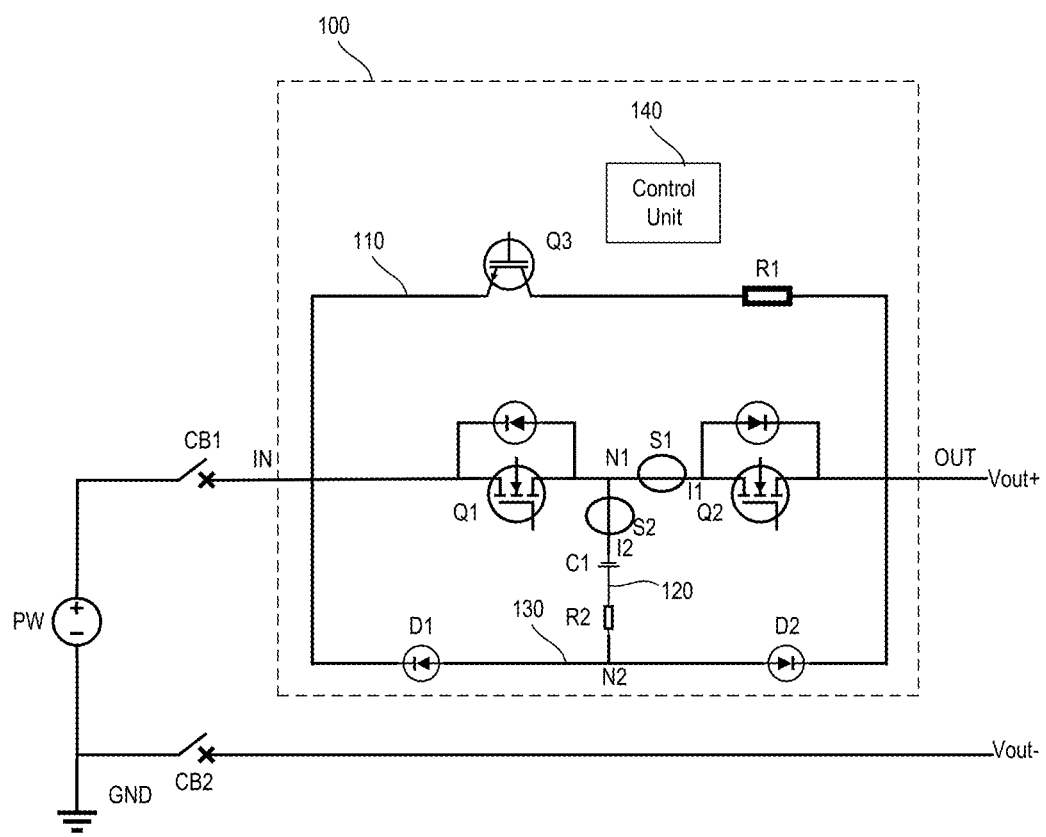
FIG. 1 shows a circuit diagram of a solid-state circuit breaker of an embodiment of the present disclosure.

The following will describe the embodiments of the present disclosure in more detail with reference to the accompanying drawings. Although some embodiments of the present disclosure are shown in the drawings, it should be understood that the present disclosure can be implemented in various forms and should not be construed as limited to the embodiments set forth herein. On the contrary, these embodiments are provided for a more thorough and complete understanding of the present disclosure. It should be understood that the drawings and embodiments of the present disclosure are for illustrative purposes only and are not intended to limit the scope of protection of the present disclosure.

In the description of the embodiments of the present disclosure, the term "including" and similar terms should be understood as open-ended inclusion, that is, "including but not limited to". The term "based on" should be understood as "at least partially based on". The terms "one embodiment" or "the embodiment" should be understood as "at least one embodiment". The term "some embodiments"

should be understood as "at least some embodiments". The following may also include other explicit and implicit definitions. The terms "first", "second", etc. may refer to different or identical objects. The following may also include other explicit and implicit definitions.

As described above, most solid-state circuit breakers in the industry have not considered regular self-test for the solid-state switching devices, or only partial self-test for switching-off function of the circuit breaker can be achieved by briefly turning off the solid-state switching devices during operation. Therefore, conventional solid-state circuit breakers lack a perfect self-test function for the solid-state switching devices, which has safety hazards, and self-test in the event of power down will affect the operation of the subsequent circuit. Embodiments of the present disclosure provides a self-test scheme for the solid-state circuit breaker, which can provide self-test function in two situations, i.e., before the solid-state circuit breaker is powered on and during operation of the solid-state circuit breaker to ensure the safety and reliability of the solid-state circuit breaker and will not affect the operation of the subsequent circuit. Embodiments of the present disclosure will be described hereafter in conjunction with FIGS. 1 to 7.

FIG. 1 shows a circuit diagram of a solid-state circuit breaker of an embodiment of the present disclosure. FIG. 1 shows setting a solid-state circuit breaker only in a single-phase circuit of a main circuit as an example to describe the principle of the present disclosure. It should be understood that in the embodiments of the present disclosure, a solid-state circuit breaker may be provided separately for each phase circuit, or a solid-state circuit breaker may be provided in a portion of a multiphase circuit, all of which fall within the scope of the present disclosure.

FIG. 1 shows an L-phase line and an N-phase line. The L-phase line is connected to the positive electrode of a power supply PW, and the N-phase line is connected to the negative electrode of the power supply PW and connected to ground GND. The L-phase line is provided with a mechanical switch CB1, and the N-phase line is provided with a mechanical switch CB2. The L-phase line is provided with a solid-state circuit breaker 100.

As shown in FIG. 1, the solid-state circuit breaker 100 described herein includes an input end IN and an output end OUT. The input end IN is connected to the mechanical switch CB1, and the output end OUT is used to provide an output voltage Vout to the subsequent circuit.

The solid-state circuit breaker 100 further includes a first switching device Q1 and a second switching device Q2 connected in series between the input end IN and the output end OUT. The first switching device Q1 is connected between the input end IN and a first node N1, and the second switching device Q2 is connected between the first node N1 and the output end OUT. The first switching device Q1 and the second switching device Q2 are respectively formed with a freewheeling diode. The anode of the freewheeling diode of the first switching device Q1 is connected to the first node N1, and the cathode of the freewheeling diode of the first switching device Q1 is connected to the input end IN. The anode of the freewheeling diode of the second switching device Q2 is connected to the first node N1, and the cathode of the freewheeling diode of the second switching device Q2 is connected to the output end OUT.

The solid-state circuit breaker 100 further includes a third switching device Q3 and a first resistive element R1. The third switching device Q3 and the first resistive element R1 are connected in series between the input end IN and the output end OUT and form a current limiting circuit 110. The third switching device Q3 and the first resistive element R1 on one hand can be used to implement self-test of the first switching device Q1 and the second switching device Q2, and on the other hand, can implement short-circuit protection on the solid-state circuit breaker 100, which will be described in detail below in conjunction with FIGS. 2 to 7.

The solid-state circuit breaker 100 further includes an auxiliary power branch 120 connected between the first node N1 and a second node N2. In an embodiment, the auxiliary power branch 120 includes an auxiliary power supply C1 and a second resistive element R2 connected in series between the first node N1 and the second node N2. The auxiliary power supply C1 can draw power from the power supply PW at a position before the switches CB1 and CB2, and is used to provide a driving voltage to control terminals of the first switching device Q1, the second switching device Q2, and the third switching device Q3.

The solid-state circuit breaker 100 further includes an anti-reverse connection circuit 130 connected between the second node N2 and the input end IN and between the second node N2 and the output end OUT to allow current to flow unidirectionally from the second node N2 to the input end IN and the output end OUT, but not in the opposite direction. In an embodiment, the anti-reverse connection circuit 130 includes a first anti-reverse diode D1 and a second anti-reverse diode D2. The anode of the first anti-reverse diode D1 is connected to the second node N2, and the cathode is connected to the input end IN. The anode of the second anti-reverse diode D2 is connected to the second node N2, and the cathode is connected to the output end.

The solid-state circuit breaker 100 further includes a first current sensor S1 for sensing the current flowing through the second switching device Q2 and generating a first current signal I1. The first current signal I1 indicates the size of the current flowing through the second switching device Q2.

The solid-state circuit breaker 100 further includes a second current sensor S2 for sensing the current flowing through the auxiliary power branch 120 and generating a second current signal I2. The second current signal I2 indicates the size of the current flowing through the auxiliary power branch 120.

The solid-state circuit breaker 100 further includes a control unit 140 which may receive the first current signal I1 and the second current signal I2 from the first current sensor S1 and the second current sensor S2, and determine operation states of the first switching device Q1 and the second switching device Q2 based on the first current signal I1 and the second current signal I2.

In embodiments of the present disclosure, the solid-state circuit breaker 100 can detect the operation states of the first switching device Q1 and the second switching device Q2 using the self-test scheme specially designed for the first switching device Q1 and the second switching device Q2. Moreover, the solid-state circuit breaker 100 can provide the self-test function in both situations, i.e., before the solid-state circuit breaker is powered on and during operation of the solid-state circuit breaker. This will be described in detail below in conjunction with FIGS. 1 to 7.

As shown in FIG. 1, in a case that the mechanical switches CB1 and CB2 are in an opened state, the first switching device Q1, the second switching device Q2 and the third switching device Q3 are initially in an off state, and no current flows in the solid-state circuit breaker 100. At this time, both the first current signal I1 detected by the first current sensor S1 and the second current signal I2 detected by the second current sensor S2 are zero.

Figure 2:
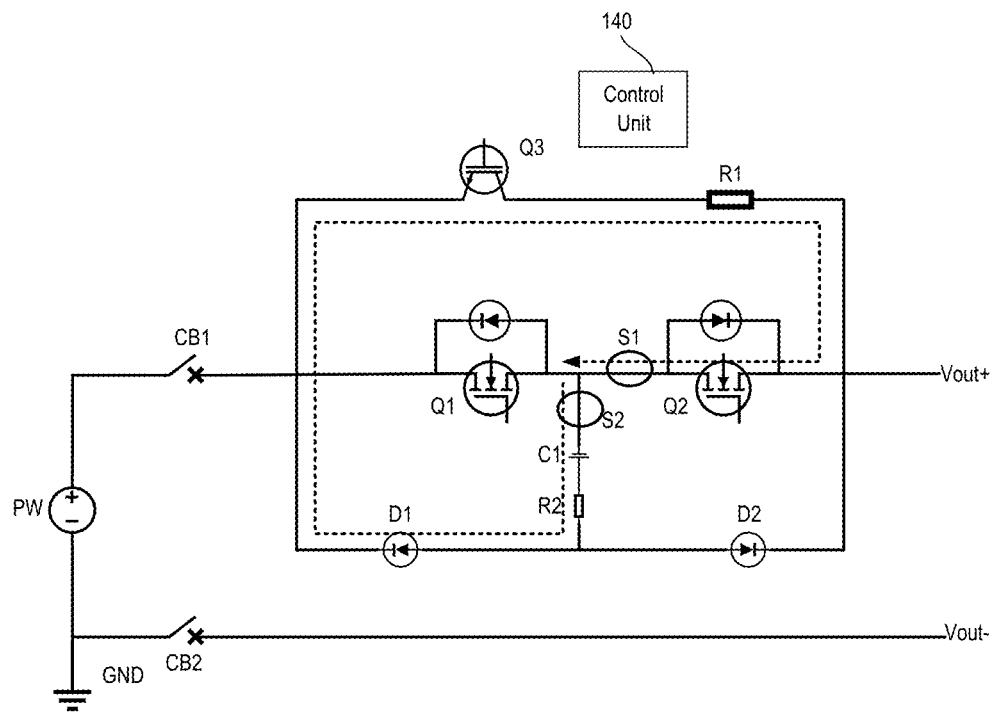
FIGS. 2 to 7 show a self-test process of the solid-state circuit breaker of an embodiment of the present disclosure.

FIG. 2 shows an inspection process of the second switching device Q2 before the solid-state circuit breaker 100 is powered on. In a case that the mechanical switch CB1 is switched from the opened state to a closed state, the control unit 140 can detect the switching operation of the mechanical switch CB1. At this time, as shown in FIG. 2, the control unit 140 sends switching-on signals to the second switching device Q2 and the third switching device Q3, forming a loop indicated by a dashed line with an arrow shown in FIG. 2. The current can flow through the second resistive element R2, the first anti-reverse diode D1, the third switching device Q3, the first resistive element R1 and the second switching device Q2 in sequence along the loop from the auxiliary power supply C1, and return to the auxiliary power supply C1. The control unit 140 receives the first current signal I1 and the second current signal I2 from the first current sensor S1 and the second current sensor S2, and determines whether the first current signal I1 and the second current signal I2 meet a first predetermined condition. The first predetermined condition comprises the first current signal I1 and the second current signal I2 being equal and not zero. The first current signal I1 and the second current signal I2 may be a predetermined value or within a predetermined range. In response to that the first current signal I1 and the second current signal I2 meet the first predetermined condition, the control unit 140 determines that the second switching device Q2 and the third switching device Q3 can be turned on normally. Conversely, if the first current signal I1 and the second current signal I2 do not meet the first predetermined condition, it indicates that the second switching device Q2 or the third switching device Q3 cannot be turned on normally. Thus, the control unit 140 generates an alarm signal for indicating a failure of the solid-state circuit breaker 100.

In some embodiments, shown in FIG. 2, in response to that the first current signal I1 and the second current signal I2 meet the first predetermined condition, the control unit 140 sends a switching-off signal to the second switching device Q2. Subsequently, the control unit 140 determines whether the first current signal I1 becomes zero to determine whether the second switching device Q2 can be turned off normally. In response to that the first current signal I1 becomes zero, the control unit 140 determines that the second switching device Q2 can be turned off normally. In response to that the first current signal I1 does not become zero, the control unit 140 generates an alarm signal for indicating that the second switching device Q2 cannot be turned off normally.

In some embodiments, shown in FIG. 2, in response to that the first current signal I1 and the second current signal I2 meet the first predetermined condition, the control unit 140 sends a switching-off signal to the third switching device Q3. Subsequently, the control unit 140 determines whether the first current signal I1 becomes zero to determine whether the third switching device Q3 can be turned off normally. In response to that the first current signal I1 becomes zero, the control unit 140 determines that the third switching device Q3 can be turned off normally. In contrast, in response to that the first current signal I1 does not become zero, the control unit 140 generates an alarm signal for indicating that the third switching device Q3 cannot be turned off normally.

Figure 3:
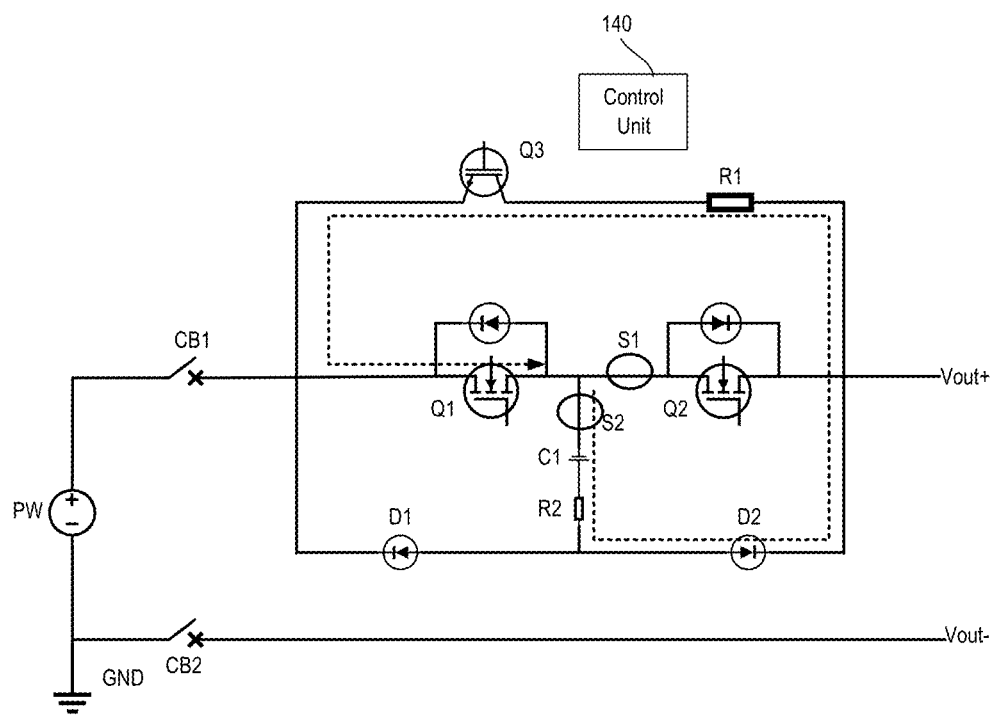

FIG. 3 shows an inspection process of the first switching device Q1 before the solid-state circuit breaker 100 is power on. As described above, in a case that the mechanical switch CB1 is switched from the opened state to the closed state, the control unit 140 can detect the switching operation of the mechanical switch CB1. At this time, as shown in FIG. 3, the control unit 140 sends switching-on signals to the first switching device Q1 and the third switching device Q3, forming a loop indicated by the dashed line with an arrow shown in FIG. 3. The current can flow through the second resistive element R2, the second anti-reverse diode D2, the first resistive element R1, the third switching device Q3 and the first switching device Q1 in sequence along the loop from the auxiliary power supply C1, and return to the auxiliary power supply C1. The control unit 140 receives the first current signal I1 and the second current signal I2 from the first current sensor S1 and the second current sensor S2, and determines whether the first current signal I1 and the second current signal I2 meet a second predetermined condition. The second predetermined condition includes the first current signal I1 being zero and the second current signal I2 being not zero. The second current signal I2 may be a predetermined value or within a predetermined range. In response to that the first current signal I1 and the second current signal I2 meet the second predetermined condition, the control unit 140 determines that the first switching device Q1 and the third switching device Q3 can be turned on normally. Conversely, if the first current signal I1 and the second current signal I2 do not meet the second predetermined condition, it indicates that the first switching device Q1 or the third switching device Q3 cannot be turned on normally. Therefore, the control unit 140 generates the signal alarm for indicating a failure of the solid-state circuit breaker 100.

In some embodiments, shown in FIG. 3, in response to that the first current signal I1 and the second current signal I2 meet the second predetermined condition, the control unit 140 sends a switching-off signal to the first switching device Q1. Subsequently, the control unit 140 determines whether the second current signal I2 becomes zero to determine whether the first switching device Q1 can be turned off normally. In response to that the second current signal I2 becomes zero, the control unit 140 determines that the first switching device Q1 can be turned off normally. In response to that the second current signal I2 does not become zero, the control unit 140 generates an alarm signal for indicating that the first switching device Q1 cannot be turned off normally.

In some embodiments, shown in FIG. 3, in response to that the first current signal I1 and the second current signal I2 meet the second predetermined condition, the control unit 140 sends a switching-off signal to the third switching device Q3. Subsequently, the control unit 140 determines whether the second current signal I2 becomes zero to determine whether the third switching device Q3 can be turned off normally. In response to that the second current signal I2 becomes zero, the control unit 140 determines that the third switching device Q3 can be turned off normally. In contrast, in response to that the second current signal I2 does not become zero, the control unit 140 generates an alarm signal for indicating that the third switching device Q3 cannot be turned off normally.

By referring to the exemplary processes described in FIGS. 2 and 3, it is able to determine whether the first switching device Q1 and the second switching device Q2 can be turned on and off normally before the solid-state circuit breaker 100 is powered on, and also to determine the operation states of the third switching device Q3. It should be understood that the processes described in conjunction with FIGS. 2 and 3 can be performed sequentially or separately, and the embodiments of the present disclosure are not intended to be limited in this respect. As an example, in a case that the mechanical switch CB1 is switched from the opened state to the closed state, the control unit 140 can first control the second switching device Q2 and the third switching device Q3 to be turned on, forming a loop as shown in FIG. 2. If the detected first current signal I1 and second current signal I2 are loop currents of the same predetermined value, it indicates that the second switching device Q2 and the third switching device Q3 can be turned on normally. Subsequently, the second switching device Q2 is turned off. If the detected first current signal I1 and second current signal I2 are zero, it indicates that the second switching device Q2 can be turned off normally, thereby completing the self-test of the second switching device Q2. Subsequently, the control unit 140 can control the first switching device Q1 and the third switching device Q3 to be turned on, forming a loop as shown in FIG. 3. If the detected first current signal I1 is zero and the detected second current signal I2 is a loop current of a predetermined value, it indicates that the first switching device Q1 can be turned on normally. Subsequently, the first switching device Q1 is switched off. If the detected first current signal I1 and second current signal I2 are zero, it indicates that the first switching device Q1 can be turned off normally, thereby completing the self-test of the first switching device Q1. Subsequently, the control unit 140 can control the first switching device Q1 to be turned on and the third switching device Q3 to be turned off. If the detected second current signal I2 is zero, it indicates that the third switching device Q3 can be turned off normally, thereby completing the self-test of the third switching device Q3.

Next, an inspection process of the operation states of the first switching device Q1 and the second switching device Q2 during the operation process after the solid-state circuit breaker 100 is powered on will be described with reference to FIGS. 4 to 7.

Figure 4:
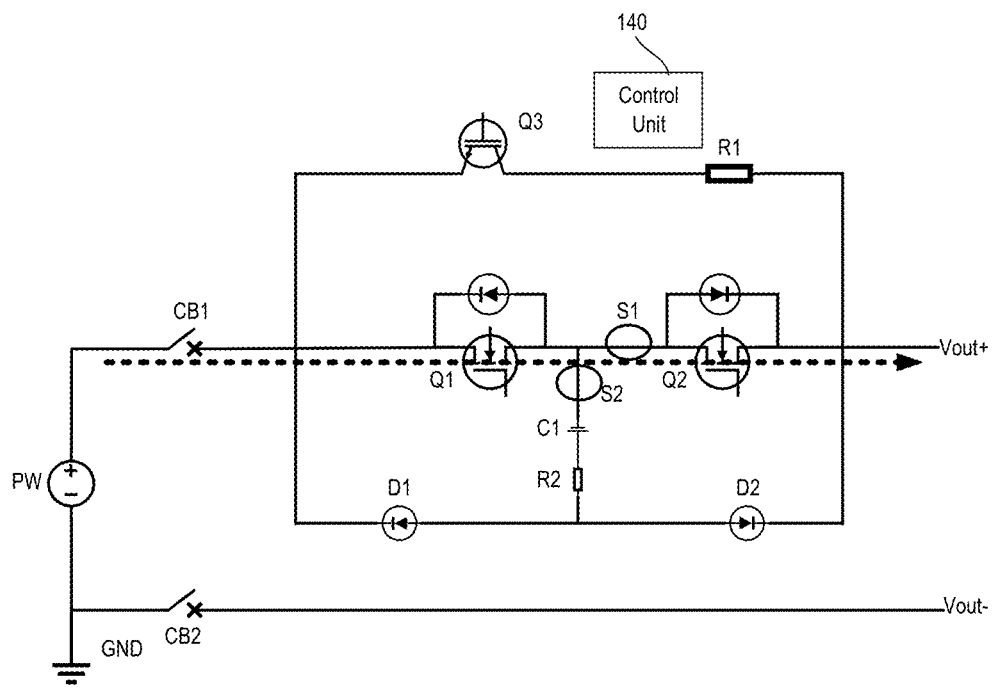

FIG. 4 shows a current path in the solid-state circuit breaker 100 in a case that the first switching device Q1 and the second switching device Q2 are switched on. As shown in FIG. 4, the mechanical switches CB1 and CB 2 are in the closed state, and the first switching device Q1 and the second switching device Q2 are both switched on. In this case, the main circuit is turned on, and a main circuit current flows along the current path indicated by the dashed line with an arrow in FIG. 4, so that the subsequent circuit (not shown) downstream of the solid-state circuit breaker 100 can be powered on normally. In a case that the main circuit is turned on, the operation states of the first switching device Q1 and the second switching device Q2 can be periodically detected. For example, the operation states of the switching devices can be detected daily, weekly, monthly, or at other cycles.

Figure 5:
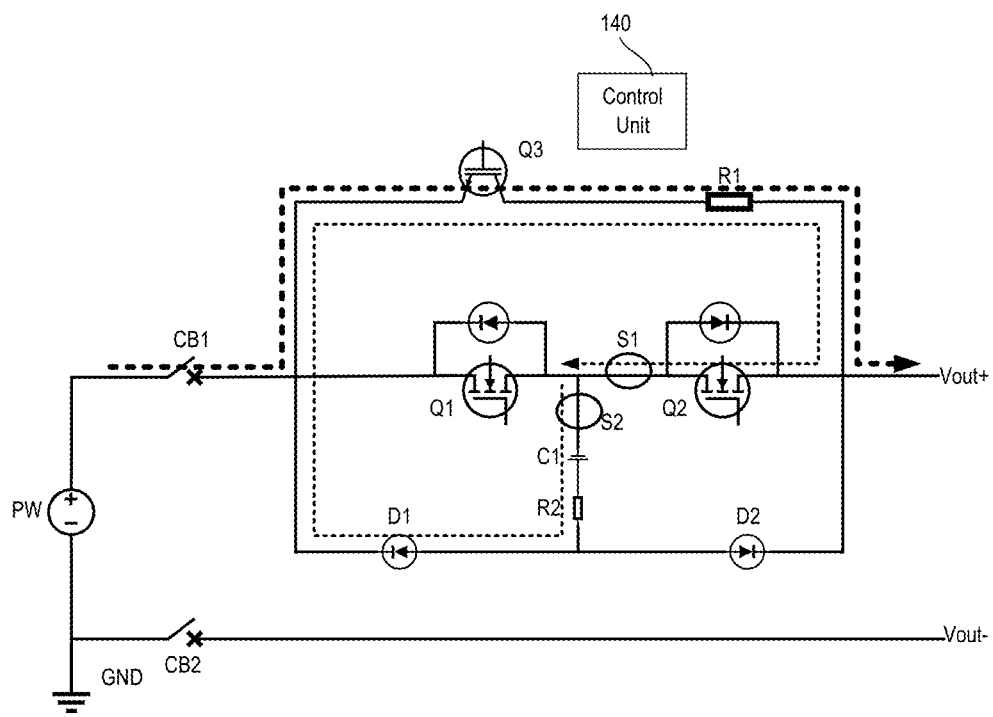

FIG. 5 shows an inspection process of the first switching device Q1 in a case that the main circuit is turned on. As shown in FIG. 5, in a case that the mechanical switch CB1 is in the closed state and the first switching device Q1 and the second switching device Q2 are switched on, the control unit 140 sends a switching-on signal to the third switching device Q3 and sends a switching-off signal to the first switching device Q1, thereby forming two loops indicated by the dashed lines with arrows shown in FIG. 5. The current can flow from the mechanical switch CB1 along one loop to the subsequent circuit via the third switching device Q3 and the first resistive element R1. The current can also flow through the second resistive element R2, the first anti-reverse diode D1, the third switching device Q3, the first resistive element R1 and the second switching device Q2 in sequence along another loop from the auxiliary power supply C1, and return to the auxiliary power supply C1. The control unit 140 receives the first current signal I1 and the second current signal I2 from the first current sensor S1 and the second current sensor S2, and determines whether the first current signal I1 and the second current signal I2 meet a third predetermined condition. The third predetermined condition includes the second current signal I2 rising from zero to a predetermined value and the first current signal I1 decreasing from the main current to a current identical to the second current signal I2. In response to that the first current signal I1 and the second current signal I2 meet the third predetermined condition, the control unit 140 determines that the first switching device Q1 can be turned off normally. In contrast, in response to that the first current signal I1 and the second current signal I2 do not meet the third predetermined condition, the control unit 140 generates an alarm signal for indicating a failure of the solid-state circuit breaker 100.

In some embodiments, as shown in FIG. 5, in response to that the second current signal I2 rises from zero to the predetermined value and the first current signal I1 decreases from the main current to a current identical to the second current signal I2, the control unit 140 sends a switching-on signal to the first switching device Q1 and sends a switching-off signal to the third switching device Q3. Subsequently, the control unit 140 determines whether the first current signal I1 restores to the main current. In response to that the first current signal I1 restores to the main current, the control unit 140 determines that the first switching device Q1 can be turned on normally. Conversely, in response to that the first current signal I1 does not restore to the main current, the control unit 140 generates an alarm signal.

Figure 6:
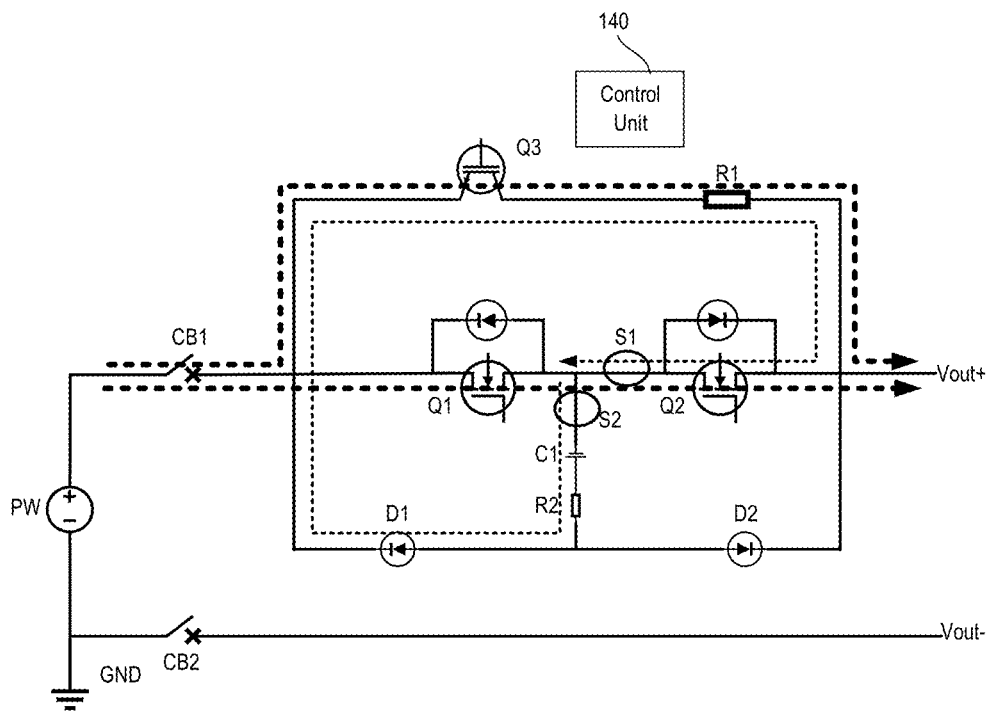
Figure 7:
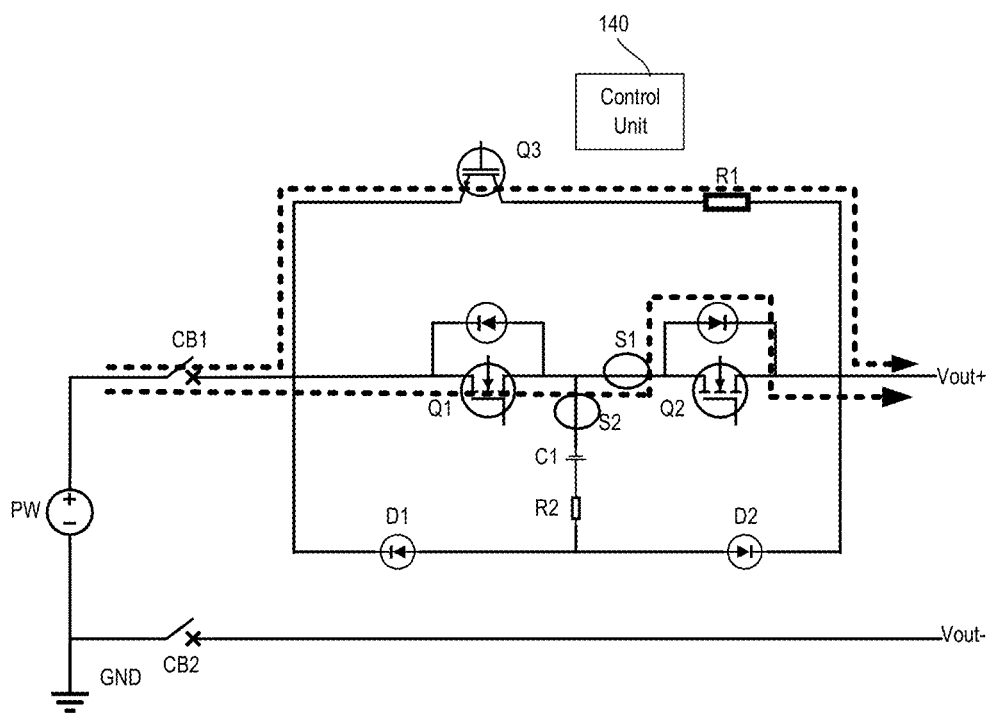

FIGS. 6 and 7 show an inspection process of the second switching device Q2 in a case that the main circuit is turned on.

As shown in FIG. 6, in a case that the mechanical switch CB1 is in the closed state and the first switching device Q1 and the second switching device Q2 are switched on, a switching-on signal is sent to the third switching device Q3, thereby forming three circuits indicated by the dashed lines with arrows shown in FIG. 6. The current can flow from the mechanical switch CB1 to the subsequent circuit via the third switching device Q3 and the first resistive element R1 along the first loop. The current can also flow from the mechanical switch CB1 to the subsequent circuit via the first switching device Q1 and the second switching device Q2 along the second loop. The current can also flow through the second resistive element R2, the first anti-reverse diode D1, the third switching device Q3, the first resistive element R1 and the second switching device Q2 in sequence along the third loop from the auxiliary power supply C1, and return to the auxiliary power supply C1. At this time, the impedance of the first loop is R1, and the impedance of the second loop is zero, so the current flowing through the mechanical switch CB1 basically flows from the second loop. The first current signal I1 is substantially equal to the main circuit current, and the second current signal I2 is a predetermined value of not zero.

As shown in FIG. 7, the second switching device Q2 is turned off so that the third loop is blocked. The current can flow from the mechanical switch CB1 to the subsequent circuit via the third switching device Q3 and the first resistive element R1 along the first loop. The current can also flow from the mechanical switch CB1 to the subsequent circuit via the freewheeling diodes of the first switching device Q1 and the second switching device Q2 along the second loop. At this time, the second current signal I2 decreases from the set value to zero. However, due to the presence of the freewheeling diode of the second switching device Q2, the first current signal I1 is basically unchanged.

In some embodiments, as shown in FIGS. 6 and 7, in a case that the mechanical switch CB1 is in the closed state and the first switching device Q1 and the second switching device Q2 are turned on, the control unit 140 sends a switching-on signal to the third switching device Q3 and sends a switching-off signal to the second switching device Q2. The control unit 140 receives the first current signal I1 and the second current signal I2 from the first current sensor S1 and the second current sensor S2, and determines whether the first current signal I1 and the second current signal I2 meet a fourth predetermined condition. The fourth predetermined condition includes the second current signal I2 decreasing from a predetermined value to zero and the first signal current I1 being in proximity to the main current. In response to that the first current signal I1 and the second current signal I2 meet the fourth predetermined condition, the control unit 140 determines that the second switching device Q2 can be turned off normally. Conversely, if the first current signal I1 and the second current signal I2 do not meet the fourth predetermined condition, it indicates that the second switching device Q2 cannot be turned off normally. Thus, the control unit 140 generates an alarm signal for indicating a failure of the solid-state circuit breaker 100.

In some embodiments, as shown in FIG. 7, in response to that the first current signal I1 and the second current signal I2 meet the fourth predetermined condition, the control unit 140 sends a switching-off signal to the third switching device Q3 and sends a switching-on signal to the second switching device Q2. Subsequently, the control unit 140 determines whether the first current signal I1 restores to the main current. In response to that the first current signal I1 restores to the main current, the control unit 140 determines that the second switching device Q2 can be turned on normally. Conversely, in response to that the first current signal I1 does not restore to the main current, the control unit 140 generates an alarm signal.

By referring to the exemplary process described in FIGS. 5 to 7, it is able to determine whether the first switching device Q1 and the second switching device Q2 can be turned on and off normally during the operation of the solid-state circuit breaker 100. It should be understood that the processes described in conjunction with FIGS. 5 to 7 can be performed sequentially or separately, and the embodiments of the present disclosure are not intended to be limited in this respect.

In some cases, there may be a short circuit in the subsequent circuit. At this time, the current flowing through the first switching device Q1 and the second switching device Q2 increases sharply. To this end, in some embodiments, in a case that the mechanical switch CB1 is in the closed state and the first switching device Q1 and the second switching device Q2 are turned on, in response to that the first current signal I1 is greater than a short-circuit current threshold, the control unit 140 sends switching-off signals to the first switching device Q1 and the second switching device Q2 and sends a switching-on signal to the third switching device Q3. After a predetermined time period has passed, the control unit 140 sends a switching-off signal to the third switching device Q3. In this way, short circuit protection can be realized for the subsequent circuit.

According to embodiments of the present disclosure, the operation states of the solid-state switching devices can be detected before the main circuit is powered on, and accurate self-test can be realized even in a case that the subsequent circuit is not powered off. The circuit structure of the scheme is simple and no additional excitation power is required. In addition, automatic detection can be performed regularly according to the settings during the operation of the solid-state circuit breaker.

Embodiments of the present disclosure also provides a method for performing self-test of the solid-state circuit breaker 100. The solid-state circuit breaker 100 comprises an input end IN and an output end OUT, the input end IN being adapted to be connected to a mechanical switch CB1; a first switching device Q1 connected between the input end IN and a first node N1; a second switching device Q2 connected between the first node N1 and the output end OUT; a third switching device Q3 and a first resistive element R1 connected in series between the input end IN and the output end OUT; an auxiliary power branch 120 connected between the first node N1 and a second node N2; an anti-reverse connection circuit 130 connected between the second node N2 and the input end IN and between the second node N2 and the output end OUT, and configured to allow a current to flow unidirectionally from the second node N2 to the input end IN and the output end OUT; a first current sensor S1 configured to sense a current flowing through the second switching device Q2 and generate a first current signal I1; and a second current sensor S2 configured to sense a current flowing through the auxiliary power branch 120 and generate a second current signal I2. The method comprises: receiving the first current signal I1 from the first current sensor S1; receiving the second current signal I2 from the second current sensor S2; and determining operation states of the first switching device Q1 and the second switching device Q2 based on the first current signal I1 and the second current signal I2.

In some embodiments, the operation states of the first switching device Q1 and the second switching device Q2 are determined by: sending switching-on signals to the second switching device Q2 and the third switching device Q3 in a case that the mechanical switch CB1 is switched from an opened state to a closed state; determining whether the first current signal I1 and the second current signal I2 meet a first predetermined condition, the first predetermined condition comprising the first current signal I1 and the second current signal I2 being equal and not zero; determining that the second switching device Q2 and the third switching device Q3 can be turned on normally, in response to that the first current signal I1 and the second current signal I2 meet the first predetermined condition; and generating an alarm signal for indicating a failure of the solid-state circuit breaker 100, in response to that the first current signal I1 and the second current signal I2 do not meet the first predetermined condition.

In some embodiments, the operation states of the first switching device Q1 and the second switching device Q2 are determined by: sending a switching-off signal to the second switching device Q2, in response to that the first current signal I1 and the second current signal I2 meet the first predetermined condition; determining whether the first current signal I1 becomes zero; determining that the second switching device Q2 can be turned off normally, in response to that the first current signal I1 becomes zero; and generating the alarm signal in response to that the first current signal I1 does not become zero.

In some embodiments, the operation states of the first switching device Q1 and the second switching device Q2 are determined by: sending switching-on signals to the first switching device Q1 and the third switching device Q3 in a case that the mechanical switch CB1 is switched from an opened state to a closed state; determining whether the first current signal I1 and the second current signal I2 meet a second predetermined condition, the second predetermined condition comprising the first current signal I1 being zero and the second current signal I2 being not zero; determining that the first switching device Q1 and the third switching device Q3 can be turned on normally, in response to that the first current signal I1 and the second current signal I2 meet the second predetermined condition; and generating an alarm signal for indicating a failure of the solid-state circuit breaker 100, in response to that the first current signal I1 and the second current signal I2 do not meet the second predetermined condition.

In some embodiments, the operation states of the first switching device Q1 and the second switching device Q2 are determined by: sending a switching-off signal to the first switching device Q1 in response to that the first current signal I1 and the second current signal I2 meet the second predetermined condition; determining whether the second current signal I2 becomes zero; determining that the first switching device Q1 can be turned off normally, in response to that the second current signal I2 becomes zero; and generating the alarm signal in response to that the second current signal I2 does not become zero.

In some embodiments, the operation states of the first switching device Q1 and the second switching device Q2 are determined by: sending a switching-on signal to the third switching device Q3 and sending a switching-off signal to the first switching device Q1, in a case that the mechanical switch CB1 is in a closed state and the first switching device Q1 and the second switching device Q2 are switched on; determining whether the first current signal I1 and the second current signal I2 meet a third predetermined condition, the third predetermined condition comprising the second current signal I2 rising from zero to a predetermined value and the first current signal I1 decreasing from a main current to a current identical to the second current signal I2; determining that the first switching device Q1 can be turned off normally, in response to that the first current signal I1 and the second current signal I2 meet the third predetermined condition; and generating an alarm signal for indicating a failure of the solid-state circuit breaker 100, in response to that the first current signal I1 and the second current signal I2 do not meet the third predetermined condition.

In some embodiments, the operation states of the first switching device Q1 and the second switching device Q2 are determined by: sending a switching-on signal to the first switching device Q1 and sending a switching-off signal to the third switching device Q3 in response to that the first current signal I1 and the second current signal I2 meet the third predetermined condition; determining whether the first current signal I1 restores to the main current; determining that the first switching device Q1 can be turned on normally, in response to that the first current signal I1 restores to the main current; and generating the alarm signal in response to that the first current signal I1 does not restore to the main current.

In some embodiments, the operation states of the first switching device Q1 and the second switching device Q2 are determined by: sending a switching-on signal to the third switching device Q3 and sending a switching-off signal to the second switching device Q2, in a case that the mechanical switch CB1 is in a closed state and the first switching device Q1 and the second switching device Q2 are switched on; determining whether the first current signal I1 and the second current signal I2 meet a fourth predetermined condition, the fourth predetermined condition comprising the second current signal I2 decreasing from a predetermined value to zero and the first current signal I1 being in proximity to the main current; determining that the second switching device Q2 can be turned off normally, in response to that the first current signal I1 and the second current signal I2 meet the fourth predetermined condition; and generating an alarm signal for indicating a failure of the solid-state circuit breaker 100, in response to that the first current signal I1 and the second current signal I2 do not meet the fourth predetermined condition.

In some embodiments, the operation states of the first switching device Q1 and the second switching device Q2 are determined by: sending a switching-on signal to the second switching device Q2 and sending a switching-off signal to the third switching device Q3 in response to that the first current signal I1 and the second current signal I2 meet the fourth predetermined condition; determining whether the first current signal I1 restores to the main current; determining that the second switching device Q2 can be turned on normally, in response to that the first current signal I1 restores to the main current; and generating the alarm signal in response to that the first current signal I1 does not restore to the main current.

In some embodiments, the method described herein further comprises: sending switching-off signals to the first switching device Q1 and the second switching device Q2 and sending a switching-on signal to the third switching device Q3, in response to that the first current signal I1 is greater than a short-circuit current threshold, in a case that the mechanical switch CB1 is in a closed state and the first switching device Q1 and the second switching device Q2 are switched on; and sending a switching-off signal to the third switching device Q3 after a predetermined time period has passed.

Various embodiments of the present disclosure have been described above, which are exemplary, not exhaustive, and are not limited to embodiments of the present disclosures. Without deviating from the scope and spirit of the various embodiments explained, many modifications and changes are apparent for those skilled in the art. The selection of terms used herein is intended to best explain the principles, practical applications, or technological improvements in the market of each embodiment, or to enable those skilled in the art to understand embodiments of the present disclosures.

What is claimed is:

1. A solid-state circuit breaker, comprising:
   an input end and an output end, the input end being adapted to be connected to a mechanical switch;
   a first switching device connected between the input end and a first node;
   a second switching device connected between the first node and the output end;
   a third switching device and a first resistive element connected in series between the input end and the output end;
   an auxiliary power branch connected between the first node and a second node;
   an anti-reverse connection circuit connected between the second node and the input end and between the second node and the output end, and configured to allow a current to flow unidirectionally from the second node to the input end and the output end;
   a first current sensor configured to sense a current flowing through the second switching device and generate a first current signal;
   a second current sensor configured to sense a current flowing through the auxiliary power branch and generate a second current signal; and a control unit configured to determine operation states of the first switching device and the second switching device based on the first current signal and the second current signal.

2. The solid-state circuit breaker of claim 1, wherein the control unit is further configured to:
send switching-on signals to the second switching device and the third switching device in a case that the mechanical switch is switched from an opened state to a closed state;
determine whether the first current signal and the second current signal meet a first predetermined condition, the first predetermined condition comprising the first current signal and the second current signal being equal and not zero;
determine that the second switching device and the third switching device can be turned on normally, in response to that the first current signal and the second current signal meet the first predetermined condition; and
generate an alarm signal for indicating a failure of the solid-state circuit breaker, in response to that the first current signal and the second current signal do not meet the first predetermined condition.

3. The solid-state circuit breaker of claim 2, wherein the control unit is further configured to:
send a switching-off signal to the second switching device, in response to that the first current signal and the second current signal meet the first predetermined condition;
determine whether the first current signal becomes zero;
determine that the second switching device can be turned off normally, in response to that the first current signal becomes zero; and
generate the alarm signal in response to that the first current signal does not become zero.

4. The solid-state circuit breaker of claim 2, wherein the control unit is further configured to:
send a switching-off signal to the third switching device in response to that the first current signal and the second current signal meet the first predetermined condition;
determine whether the first current signal becomes zero;
determine that the third switching device can be turned off normally, in response to that the first current signal becomes zero; and
generate the alarm signal in response to that the first current signal does not become zero.

5. The solid-state circuit breaker of claim 1, wherein the control unit is further configured to:
send switching-on signals to the first switching device and the third switching device in a case that the mechanical switch is switched from an opened state to a closed state;
determine whether the first current signal and the second current signal meet a second predetermined condition, the second predetermined condition comprising the first current signal being zero and the second current signal being not zero;
determine that the first switching device and the third switching device can be turned on normally, in response to that the first current signal and the second current signal meet the second predetermined condition; and
generate an alarm signal for indicating a failure of the solid-state circuit breaker, in response to that the first current signal and the second current signal do not meet the second predetermined condition.

6. The solid-state circuit breaker of claim 5, wherein the control unit is further configured to:
send a switching-off signal to the first switching device in response to that the first current signal and the second current signal meet the second predetermined condition;
determine whether the second current signal becomes zero;
determine that the first switching device can be turned off normally, in response to that the second current signal becomes zero; and
generate the alarm signal in response to that the second current signal does not become zero.

7. The solid-state circuit breaker of claim 5, wherein the control unit is further configured to:
send a switching-off signal to the third switching device in response to that the first current signal and the second current signal meet the second predetermined condition;
determine whether the second current signal becomes zero;
determine that the third switching device can be turned off normally, in response to that the second current signal becomes zero; and
generate the alarm signal in response to that the second current signal does not become zero.

8. The solid-state circuit breaker of claim 1, wherein the control unit is further configured to:
send a switching-on signal to the third switching device and send a switching-off signal to the first switching device, in a case that the mechanical switch is in a closed state and the first switching device and the second switching device are switched on;
determine whether the first current signal and the second current signal meet a third predetermined condition, the third predetermined condition comprising the second current signal rising from zero to a predetermined value and the first current signal decreasing from a main current to a current identical to the second current signal;
determine that the first switching device can be turned off normally, in response to that the first current signal and the second current signal meet the third predetermined condition; and
generate an alarm signal for indicating a failure of the solid-state circuit breaker, in response to that the first current signal and the second current signal do not meet the third predetermined condition.

9. The solid-state circuit breaker of claim 8, wherein the control unit is further configured to:
send a switching-on signal to the first switching device and send a switching-off signal to the third switching device in response to that the first current signal and the second current signal meet the third predetermined condition;
determine whether the first current signal restores to the main current;
determine that the first switching device can be turned on normally, in response to that the first current signal restores to the main current; and
generate the alarm signal in response to that the first current signal does not restore to the main current.

10. The solid-state circuit breaker of claim 1, wherein the control unit is further configured to:
send a switching-on signal to the third switching device and send a switching-off signal to the second switching device, in a case that the mechanical switch is in a closed state and the first switching device and the second switching device are switched on;

determine whether the first current signal and the second current signal meet a fourth predetermined condition, the fourth predetermined condition comprising the second current signal decreasing from a predetermined value to zero and the first current signal being in proximity to the main current;

determine that the second switching device can be turned off normally, in response to that the first current signal and the second current signal meet the fourth predetermined condition; and generate an alarm signal for indicating a failure of the solid-state circuit breaker, in response to that the first current signal and the second current signal do not meet the fourth predetermined condition.

11. The solid-state circuit breaker of claim 10, wherein the control unit is further configured to:

send a switching-on signal to the second switching device and send a switching-off signal to the third switching device in response to that the first current signal and the second current signal meet the fourth predetermined condition;

determine whether the first current signal restores to the main current;

determine that the second switching device can be turned on normally, in response to that the first current signal restores to the main current; and generate the alarm signal in response to that the first current signal does not restore to the main current.

12. The solid-state circuit breaker of claim 1, wherein the control unit is further configured to:

send switching-off signals to the first switching device and the second switching device and send a switching-on signal to the third switching device, in response to that the first current signal is greater than a short-circuit current threshold, in a case that the mechanical switch is in a closed state and the first switching device and the second switching device are switched on; and send a switching-off signal to the third switching device after a predetermined time period has passed.

13. A method for performing self-test of a solid-state circuit breaker, the solid-state circuit breaker comprising an input end and an output end, the input end being adapted to be connected to a mechanical switch; a first switching device connected between the input end and a first node; a second switching device connected between the first node and the output end; a third switching device and a first resistive element connected in series between the input end and the output end; an auxiliary power branch connected between the first node and a second node; an anti-reverse connection circuit connected between the second node and the input end and between the second node and the output end, and configured to allow a current to flow unidirectionally from the second node to the input end and the output end; a first current sensor configured to sense a current flowing through the second switching device and generate a first current signal; and a second current sensor configured to sense a current flowing through the auxiliary power branch and generate a second current signal;

the method comprising:

receiving the first current signal from the first current sensor;

receiving the second current signal from the second current sensor; and determining operation states of the first switching device and the second switching device based on the first current signal and the second current signal.

14. The method of claim 13, wherein the operation states of the first switching device and the second switching device are determined by:

sending switching-on signals to the second switching device and the third switching device in a case that the mechanical switch is switched from an opened state to a closed state;

determining whether the first current signal and the second current signal meet a first predetermined condition, the first predetermined condition comprising the first current signal and the second current signal being equal and not zero;

determining that the second switching device and the third switching device can be turned on normally, in response to that the first current signal and the second current signal meet the first predetermined condition; and generating an alarm signal for indicating a failure of the solid-state circuit breaker, in response to that the first current signal and the second current signal do not meet the first predetermined condition.

15. The method of claim 14, wherein the operation states of the first switching device and the second switching device are determined by:

sending a switching-off signal to the second switching device, in response to that the first current signal and the second current signal meet the first predetermined condition;

determining whether the first current signal becomes zero;

determining that the second switching device can be turned off normally, in response to that the first current signal becomes zero; and generating the alarm signal in response to that the first current signal does not become zero.

16. The method of claim 13, wherein the operation states of the first switching device and the second switching device are determined by:

sending switching-on signals to the first switching device and the third switching device in a case that the mechanical switch is switched from an opened state to a closed state;

determining whether the first current signal and the second current signal meet a second predetermined condition, the second predetermined condition comprising the first current signal being zero and the second current signal being not zero;

determining that the first switching device and the third switching device can be turned on normally, in response to that the first current signal and the second current signal meet the second predetermined condition; and generating an alarm signal for indicating a failure of the solid-state circuit breaker, in response to that the first current signal and the second current signal do not meet the second predetermined condition.

17. The method of claim 16, wherein the operation states of the first switching device and the second switching device are determined by:

sending a switching-off signal to the first switching device in response to that the first current signal and the second current signal meet the second predetermined condition;

determining whether the second current signal becomes zero;

determining that the first switching device can be turned off normally, in response to that the second current signal becomes zero; and generating the alarm signal in response to that the second current signal does not become zero.

18. The method of claim 13, wherein the operation states of the first switching device and the second switching device are determined by:

sending a switching-on signal to the third switching device and sending a switching-off signal to the first switching device, in a case that the mechanical switch is in a closed state and the first switching device and the second switching device are switched on;

determining whether the first current signal and the second current signal meet a third predetermined condition, the third predetermined condition comprising the second current signal rising from zero to a predetermined value and the first current signal decreasing from a main current to a current identical to the second current signal;

determining that the first switching device can be turned off normally, in response to that the first current signal and the second current signal meet the third predetermined condition; and generating an alarm signal for indicating a failure of the solid-state circuit breaker, in response to that the first current signal and the second current signal do not meet the third predetermined condition.

19. The method of claim 18, wherein the operation states of the first switching device and the second switching device are determined by:

sending a switching-on signal to the first switching device and sending a switching-off signal to the third switching device in response to that the first current signal and the second current signal meet the third predetermined condition;

determining whether the first current signal restores to the main current;

determining that the first switching device can be turned on normally, in response to that the first current signal restores to the main current; and generating the alarm signal in response to that the first current signal does not restore to the main current.

20. The method of claim 13, wherein the operation states of the first switching device and the second switching device are determined by:

sending a switching-on signal to the third switching device and sending a switching-off signal to the second switching device, in a case that the mechanical switch is in a closed state and the first switching device and the second switching device are switched on;

determining whether the first current signal and the second current signal meet a fourth predetermined condition, the fourth predetermined condition comprising the second current signal decreasing from a predetermined value to zero and the first current signal being in proximity to the main current;

determining that the second switching device can be turned off normally, in response to that the first current signal and the second current signal meet the fourth predetermined condition; and generating an alarm signal for indicating a failure of the solid-state circuit breaker, in response to that the first current signal and the second current signal do not meet the fourth predetermined condition.

* * * * *